United States Patent [19]

Steffen

[11] Patent Number: 6,071,758
[45] Date of Patent: *Jun. 6, 2000

[54] PROCESS FOR MANUFACTURING A CHIP CARD MICROMODULE WITH PROTECTION BARRIERS

[75] Inventor: Francis Steffen, Saint-Maximin, France

[73] Assignee: SGS-Thomson Microelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 08/748,343

[22] Filed: Nov. 13, 1996

[30] Foreign Application Priority Data

Nov. 14, 1995 [FR] France .................................. 95-13488

[51] Int. Cl.[7] ............................ H01L 21/50; B29C 13/00
[52] U.S. Cl. ...................... 438/112; 438/123; 264/272.17
[58] Field of Search .................................. 438/25, 26, 51, 438/64, 112, 123, 124, 127, 964; 264/272.17; 257/667

[56] References Cited

U.S. PATENT DOCUMENTS

| | | | |
|---|---|---|---|
| 3,539,675 | 11/1970 | Hugill | 264/272.17 |
| 3,641,254 | 2/1972 | Bunting et al. | 264/272.17 |
| 4,490,902 | 1/1985 | Eytcheson et al. | 29/588 |
| 4,857,483 | 8/1989 | Steffen et al. | |
| 4,862,246 | 8/1989 | Masuda et al. | 357/70 |
| 4,990,759 | 2/1991 | Gloton et al. | 235/492 |
| 5,041,395 | 8/1991 | Steffen | 437/206 |
| 5,147,982 | 9/1992 | Steffen | 174/52.2 |
| 5,218,861 | 6/1993 | Brown et al. | 73/146.5 |
| 5,258,331 | 11/1993 | Masumoto et al. | 624/272.17 |
| 5,270,262 | 12/1993 | Switky et al. | |
| 5,365,655 | 11/1994 | Rose | |
| 5,420,757 | 5/1995 | Eberhardt et al. | 361/813 |
| 5,446,080 | 8/1995 | Shima et al. | 524/99 |
| 5,468,993 | 11/1995 | Tani | 257/676 |
| 5,486,722 | 1/1996 | Sato et al. | 257/666 |
| 5,569,879 | 10/1996 | Gloton et al. | 174/52.2 |
| 5,637,273 | 6/1997 | Goo | 264/272.15 |
| 5,640,306 | 6/1997 | Gaumet et al. | 361/737 |

FOREIGN PATENT DOCUMENTS

| | | |
|---|---|---|
| 0 391 790 A1 | 10/1990 | European Pat. Off. . |
| 0 535 882 | 4/1993 | European Pat. Off. ........ H01L 21/48 |
| 2684235 | 5/1993 | France . |
| 2684802 | 6/1993 | France . |
| 55-118640 | 9/1980 | Japan .............................. 264/272.17 |
| 55-49966 | 12/1980 | Japan .............................. 264/272.17 |
| 84-101842 | 6/1984 | Japan .............................. 264/272.17 |
| 62-58643 | 3/1987 | Japan .............................. 264/272.17 |
| 1-220466 | 9/1989 | Japan .............................. 257/667 |
| 2-94461 | 4/1990 | Japan .............................. 257/667 |
| 2-283054 | 11/1990 | Japan .............................. 257/676 |
| 3-64035 | 3/1991 | Japan .............................. 264/272.17 |

*Primary Examiner*—David E. Graybill
*Attorney, Agent, or Firm*—Wolf, Greenfield & Sacks, P.C.; James H. Morris; Theodore E. Galanthay

[57] ABSTRACT

A method for the manufacture of a micromodule with surface flush connector, the metallic regions of the connector being formed on a support grid, comprises the formation of protection barriers between the regions of the connector so as to form a closed contour demarcating a molding zone around the chip, outside a standardized space reserved for the physical connections between the connector of the micromodule and an external system, to make a molding of thermohardening or thermoplastic material around the chip in this demarcated molding zone.

38 Claims, 3 Drawing Sheets

PROCESS FOR MANUFACTURING A CHIP CARD MICROMODULE WITH PROTECTION BARRIERS

BACKGROUND OF THE INVENTION

1. Field of the Invention

The invention relates to a method for the manufacture of a micromodule with flush connectors.

A micromodule is the miniature unit formed chiefly by one or more integrated circuit chips and a connector formed by substantially plane and thin regions made of metal. It is designed to be inserted into an information carrier of small thickness such as a chip card or memory key so that the connector is flush with the surface of the information carrier, the chip being embedded in the carrier.

This connector enables the connection to external systems with which the chip of the micromodule will exchange information elements.

International standards define the different characteristics of the micromodule and its connector (these are the ISO 7810 to 7816 standards).

2. Discussion of the Related Art

There are various known methods used to manufacture micromodules. A particular problem of manufacture lies in the coating of the chip with resin in order to protect it from chemical pollution and mechanical stresses. Indeed, the external surface of the connector, namely the surface used for the physical connection of the micromodule to an external system should not be polluted. Whatever the prior art method, a dielectric material is used with the grid that supports the regions of the connector. This dielectric material is molded or cut out so that it covers the interstices between the different regions so as to prevent the resin from flowing over the external face of the regions of the connector. This results in lengthy and costly manufacturing methods. In particular, for the making of micromodules in tape form, using a method for the bonding of a perforated dielectric tape on a pre-slotted metal grid, it is necessary to use a dielectric material having high thermal expansion with respect to the metal grid so as there is no offset. It is also necessary to choose a dielectric that can be used in a small thickness in view of the fact that it is necessary to have small thickness for the micromodules. Finally, it is necessary to have instruments enabling high precision to cut out the tape and adjust it very precisely to the grid. These methods of manufacture are not at all standard as compared with methods used to manufacture integrated circuits.

Now, for certain applications, it is necessary to be able to manufacture micromodules in large batches at a very low cost. In particular, these are disposable prepaid chip cards (as distinct from rechargeable chip cards) and especially phone cards.

SUMMARY OF THE INVENTION

An object of the invention is to provide a method for the manufacture of micromodules with flush connectors.

In the invention, it is sought to obtain a reliable method of manufacture that is simpler to implement and therefore less costly. In particular, it has been sought to obtain a solution to overcome all the problems related to the use of a dielectric material.

One solution to this technical problem provided by the invention takes into consideration the characteristics of the connector. It appears that the physical connection of the connector of a micromodule with an external system (a card reader) can be done only in a standardized connection zone (ISO 78XX standard), hence in a perfectly defined zone. In this standardized zone, the regions of the connector should not be polluted, at least on the external face, so as to provide for accurate connection with an external machine.

According to the invention, by demarcating a molding zone around the chip outside the standardized zone of physical connection with an external system, it is possible to coat the chip with a molding of thermoplastic or thermohardening material made directly on the regions of the connector and still have the connectors free from pollution.

According to the invention, it is no longer necessary to use a dielectric layer to protect the regions of the connector during the coating.

The invention can be applied to small-sized chips for which the connection to these regions can be done in the demarcated zone according to the invention.

As characterized, the invention therefore relates to a method for the manufacture of a micromodule with surface flush connectors, the metallic regions of the connector being formed on a support grid.

According to the invention, the method comprises the formation of protection barriers between the regions of said connector so as to form a closed contour, demarcating a molding zone around the chip outside a standardized space reserved for the physical connections between the connector of the micromodule and an external system, to make a molding of thermohardening or thermoplastic material around the chip in this demarcated molding zone.

Thus, the chip can be coated with resin and still have the connector remain free from the resin.

Advantageously, a deformation is applied to the regions of the connector so that the parts of these regions within the molding zone, according to the invention, are in a plane different from the surface plane of the connector of the micromodule.

BRIEF DESCRIPTION OF THE DRAWINGS

Other features and advantages of the invention are given in the following description, made by way of an indication that in no way restricts the scope of the invention and with reference to the appended drawings, in which.

DETAILED DESCRIPTION

Figure 1:
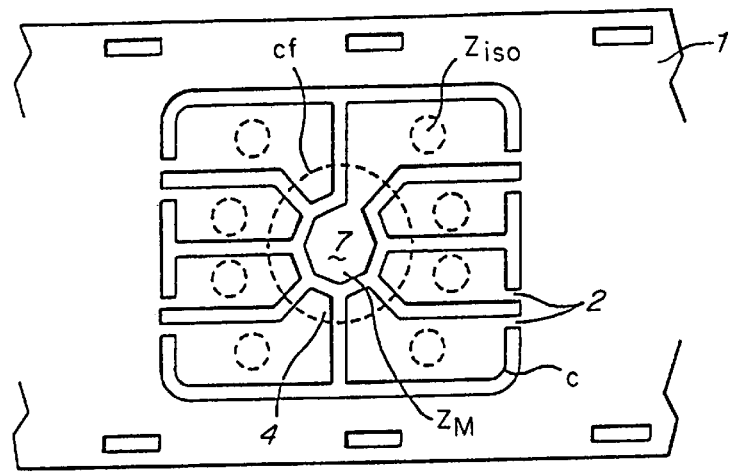
FIG. 1 shows a view of a metal grid cut out to form a micromodule connector with a supporting region of the chip.

FIG. 1 shows a support grid 1 of a micromodule connector. In the example, it is a pre-slotted metal grid on which the connector, herein comprising eight regions (c), is held to the support grid by attachments or short circuits 2.

The international standards pertaining to micromodules define, in particular, a standardized zone $Z_{iso}$ within which the physical contacts with an external system (reader) must be made for each zone of the connector. It is possible therefrom to deduce a standardized contact zone $Z_{iso}$ for each contact zone. These standardized contact zones are shown in dashes on the connector of FIG. 1. This makes it possible to highlight a zone $Z_M$ of the connector within which there are no physical contacts with an external system.

Figure 2:
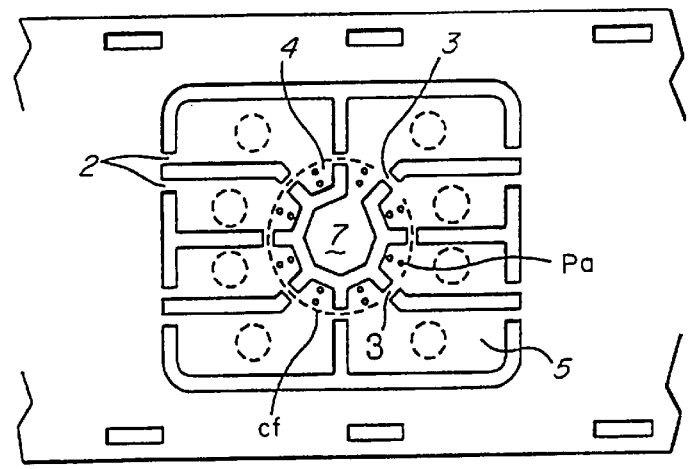
FIG. 2 shows a similar view for the making of a micromodule, according to the invention, with metal barriers between the regions to define a closed contour.

According to the invention, it is possible to physically define this zone $Z_M$ by a closed contour cf using barriers 3 placed between the regions of the connector. These barriers may be quite simply obtained in the example of FIG. 1, in the grid slotting operation, to form the regions of the connector. There is then obtained a grid as shown in FIG. 2: the regions remain, on the one hand, held to the supporting grid by short circuits 2. On the other hand, they are attached to one another by the protection barriers 3 according to the invention. These barriers are used to give concrete shape to the closed contour cf that demarcates the zone $Z_M$ with respect to the standardized physical connection zone (ISO). It is then possible to make a molding of thermohardening or thermoplastic material on the chip within the zone demarcated by the closed contour cf. It is then possible to cut out the barriers 3 between the regions and the short circuits 2 which hold the regions to the grid. There is obtained a micromodule for which the part 5 of the regions of the connector that is outside the contour cf and that includes the standardized connection zone $Z_{iso}$ with the exterior is free of the molding. The other part 4 which is within the contour cf is held by the molding that protects the chip. In the molding zone, it may happen that the resin overflows on to the external face of the regions but this is not a problem because it is outside the standardized zone reserved for physical connection within an external system.

Figure 3:
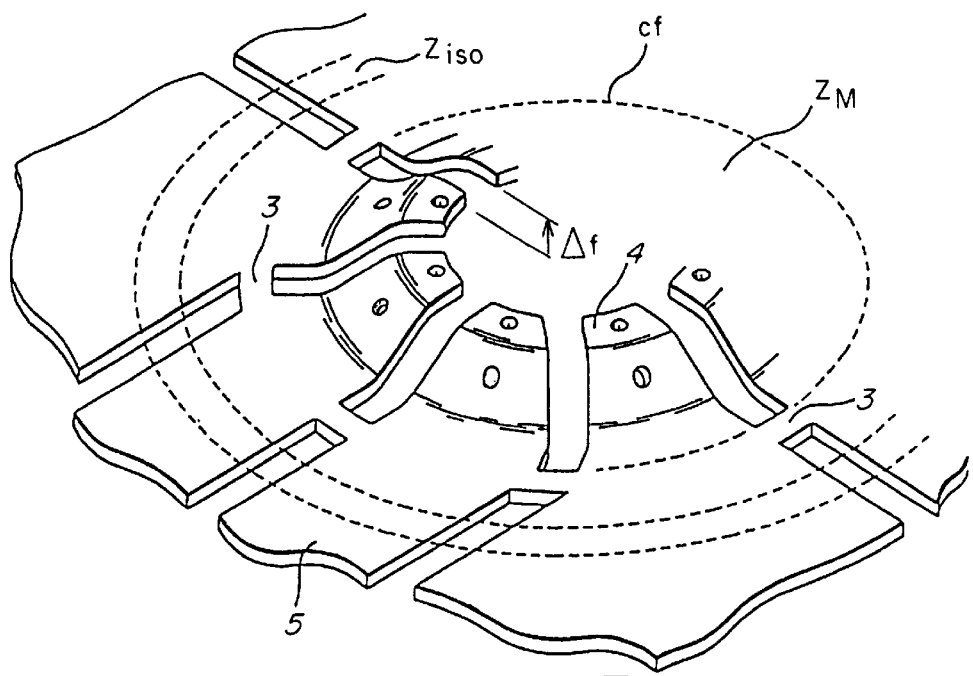
FIG. 3 shows a detail of barriers and regions of a micromodule connector in one embodiment of the invention.

Preferably, and as shown in FIG. 3, it is planned to cause a deformation $\Delta f$ on the parts 4 of the regions of the connector located within the molding zone $Z_M$ demarcated by the barriers 3, according to the invention. In this way, these parts 4 will be inserted into the molding material. This will make it easier for the thermoplastic or thermohardening material to cling to the regions of the connector. Apart from this deformation $\Delta f$, the parts 4 of the contact regions may be designed to have any known shape capable of furthering this clinging process. Normally, it will be judicious to provide for perforations Pa in these parts 4 so that the resin, in going through, will properly catch these parts. Perforations Pa of this kind have been shown in FIGS. 2 and 3. The other parts 5 of the regions of the connector, located outside the molding zone $Z_M$, demarcated by the barriers 3, according to the invention, are free of the molding.

Figure 4:
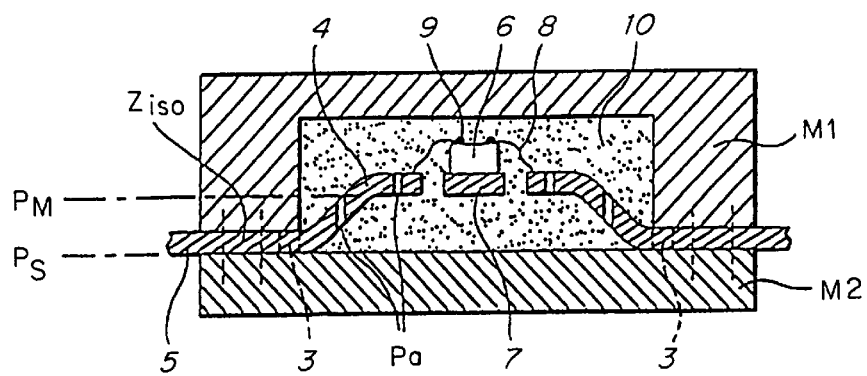
FIG. 4 shows the molding step according to the method of the invention.

A molding operation according to this method is shown in FIG. 4. The mold has two parts M1 and M2. One of these parts, M2, has a flat bottom that follows the normal external surface plane $P_s$ of the connector, and comes up against the external face of the parts 5 of the regions of the connector. The other part, M1, forms a cavity into which the molding material will be injected. The edges of the part of the mold M1 are supported on the internal face of the parts 5 of the connector up to the top of the barriers 3. In this way, when the thermoplastic or thermohardening material is injected, it remains confined to the interior flowing over into the parts 5 of the contact regions.

In this example, it can be seen that the chip 6 and the parts 4 of the contact regions inserted into the molded material 10 are located in a plane $P_M$ different from the normal surface plane $P_s$ of the connector. In this example, it can be seen that the chip has been bonded to a contact region used as a support region 7 in a central zone of the connector. And connection wires 8 have been soldered between the bumps 9 of the chip and the parts 4 of the contact regions located in the molding zone. In other words, in this example, the molding method according to the invention has been applied to the tape automatic bonding (TAB) method with wire soldering. The molded material 10 then surrounds the chip 6, its connection wires 8 and the parts 4 of the contact regions which are well anchored through the perforations Pa. The parts 5 of the contact regions outside the closed contour cf are free. They are not at all polluted by the molding operation.

Figure 5:
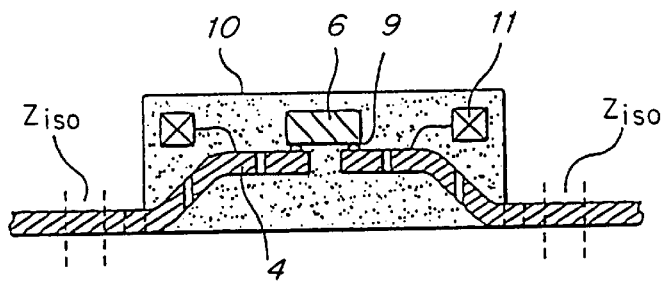
FIG. 5 shows another example of a micromodule obtained according to the method of the invention.
Figure 6:
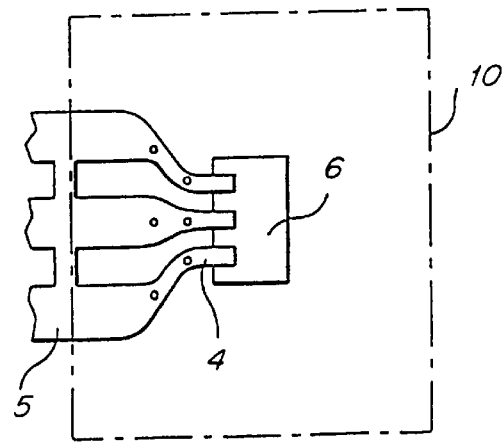
FIG. 6 shows a partial bottom view of FIG. 5.

Another example of a micromodule obtained according to the method of the invention is shown in FIG. 5. In this other example, the molding method according to the invention is applied to a flip-bonding method adapted to small-sized chips. In this method, the chip 6 is flip-bonded and its bumps 9 are directly soldered to the end of the parts 4 of the contact regions which are used both for connection and for supporting the chip. A partial bottom view of the micromodule obtained according to the invention is shown in FIG. 6.

In FIG. 5, a coil 11 has been integrated into the micromodule. This coil has the role of providing the micromodule with a twofold connective function: it is at the same time a physical connection, standardized by the parts 5 of the regions and a "contact-free" type of connection. This coil could equally well be provided in the micromodule of FIG. 4. A coil such as this may be provided within the molding (as shown). It is then placed, so that it can be held still by the molding, without any problems for the chip and its connections (especially when wires 9 are planned). When this is not possible, it can be placed outside the molding for which it is possible to design an adapted shape such as a shoulder or cavity so that the coil can be received or centered and soldered to external regions 5. In the example shown, the insulator wire of the coil has been wound around the chip, at the parts 4, the two ends soldered to these parts 4, and the coil has been immobilized in the molding.

Figure 7:
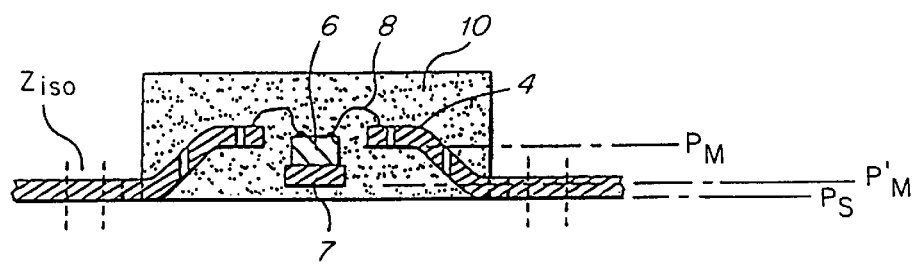
FIG. 7 shows a micromodule obtained in a variant of the method according to the invention.

Finally, another exemplary micromodule according to the invention has been shown in FIG. 7 for a method of the same type as the one described with reference to FIG. 4. In this example, the part of the supporting region 7 of the chip 6 is located in a different plane P'M from the other parts 4 of the regions of the connector located in the molding zone. This is especially useful for operations of securing and centering on the production line. In the example, the chip 6 is located in a plane beneath these parts 4. This embodiment is particularly advantageous to reduce the height of the micromodule.

Figure 8:
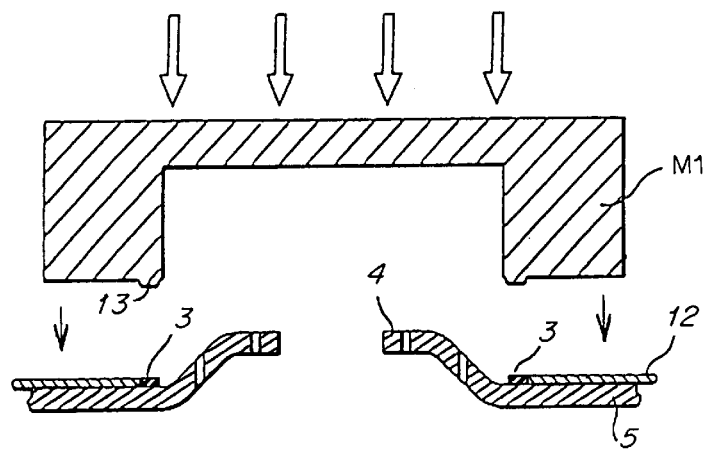
FIGS. 8 and 9 show another embodiment of the barriers according to the invention.
Figure 9:
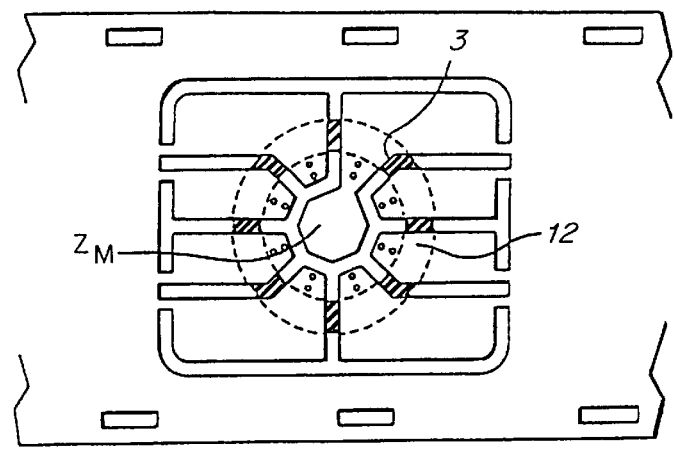

FIGS. 8 and 9 show other means to implement the method according to the invention.

FIG. 8 gives a view notably of a connector as already described with reference to FIG. 1. In this example, an adapted shape of dielectric film 12 is used, having been deposited beforehand on the connector. This dielectric film shape is hollowed out to demarcate the molding zone $Z_M$. The mold, in leaning on this shape, will make it match the shape of the connector by compression and hence make it penetrate the interstices between the regions, thus forming the barriers 3 according to the invention. The dielectric shape is a simple shape without any precise adjusting, therefore without the various drawbacks of the prior art. In these particular examples, it may broadly cover the connection surface as shown in FIG. 9. This enables the mechanical stiffening of the contact regions 5. This may also, to a certain extent, make it possible to enlarge the molding zone to apply the method of the invention to bigger chips without any risk of pollution of the external faces of the parts 5 of the regions of the connector.

An improvement of this method may consist in providing for small excess thicknesses 13 in the form of the mold M1, equal to about ten micrometers, capable of achieving greater compression at the places where the barriers have to be formed.

In the same spirit, the barriers 3 may be obtained by placing a form of elastomer seal between the mold M1 and the connector. This flexible seal forms the closed contour of the invention which will shape the barriers 3 by compression of the mold: the elastomer seal matches the shape of the connector and penetrates the interstices between the regions, thus forming the barriers 3 according to the invention. This is a low-cost method that is simple to implement but one of its drawbacks is that it requires the frequent replacement of the seal.

To overcome this drawback, this seal may be advantageously made in the mold by using an appropriate elastomer (capable of holding the molding temperature and of creeping in the interstices). This seal, which is made in the mold by a molding operation, can then remain in the micromodule thus constituted. There is then no longer any prior step of manufacture of the seal or of deposition of dielectric: everything is made in the mold, namely the barriers and the molding.

The making of the barriers according to the invention in the form of the mold itself must not be ruled out but, given the small dimensions considered, this method appears to be more difficult to implement.

All these examples described with reference to FIGS. 8 and 9 do not require any operation for cutting out the barriers after the molding. This is very advantageous.

The invention which has just been described extends to the manufacture of micromodules in tape form (continuous manufacturing method), the individual micromodules being obtained in a subsequent step of separation.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for the manufacture of a chip card-micromodule with a surface flush connector, the method comprising steps of:

forming metallic regions of the connector on a support grid, each metallic region including a predefined connection zone configured in accordance with a chip card technology standard for physically interfacing the connector with an external system; and forming protection barriers between the metallic regions of the connector for defining a closed contour demarcating a molding zone around a chip to be connected to the connector, in order to mold a body of thermohardening or thermoplastic molding material around the chip that is confined to the demarcated molding zone, the connection zones of the metallic regions being located outside the molding zone to remain free of the molding material.

2. A method for the manufacture of a module according to claim 1, wherein a deformation is applied to the metallic regions of the connector so that parts of the metallic regions within the molding zone are in a plane different from a surface plane of the connector of the micromodule.

3. A method for the manufacture of a micromodule according to claim 1, wherein an area of the connector is used as a support for the chip, wherein the supporting area is located inside the molding zone in a plane different from a plane of other regions of the connector.

4. A method for the manufacture of a micromodule according to claim 3, wherein the supporting area inside the molding zone is located in a plane between the plane of the other regions of the connector and a surface plane of the connector.

5. A method for the manufacture of a micromodule according to claim 1, wherein the parts of the metallic regions of the connector located in the molding zone have shapes that promote the clinging of the thermohardening or thermoplastic material.

6. A method for the manufacture of a micromodule according to claim 5, wherein the parts of the metallic regions of the connector are perforated.

7. A method for the manufacture of a micromodule according to claim 1, wherein the barriers are made of metal and formed with the metallic regions of the connector.

8. A method for the manufacture of a micromodule according to claim 7, wherein the metal barriers are cut out after molding the body.

9. A method for the manufacture of a micromodule according to claim 1, wherein the barriers are formed while molding the body by the compression, on the connector, of a shape of insulator material corresponding to the closed contour to be made.

10. A method for the manufacture of a micromodule according to claim 9, wherein the shape is obtained by the deposition of a dielectric material on the connector prior to molding the body.

11. A method for the manufacture of a micromodule according to claim 9, wherein the shape is formed by an elastomer seal that is placed in a mold.

12. A method for the manufacture of a micromodule according to claim 9, wherein the shape is made while molding the body, out of an elastomer material.

13. A method for the manufacture of a micromodule according to claim 9, wherein a mold is provided with a projection capable of compressing the insulator plastic material at locations where the barriers are to be made.

14. A method for the manufacture of a micromodule according to claim 1, comprising the integration of a coil providing a contact-free interface with an external system.

15. A method fir the manufacture of a micormodule according to claim 14, wherein the coil is provided within the molding and immobilized by the molding material.

16. A method for the manufacture of a micromodule according to claim 14, wherein the coil is provided outside the body.

17. A method for the manufacture of a micromodule according to claim 16, wherein the body has a shape adapted to receive said coil.

18. A method for the manufacture of individual micromodules out of a tape micromodules, according to claim 1.

19. A method of manufacturing a chip card micromodule, the method comprising steps of:

(a) forming a chip card connector that includes a slotted metal grid partitioned into no more than eight metallic regions, each metallic region including a predefined connection zone configured in accordance with a chip card technology standard for physically interfacing the connector with an external system compatible with a chip card;

(b) disposing protection barriers between the metallic regions to form a closed contour defining a molding zone that includes a portion of the metallic regions, the connection zones being located outside the molding zone:

(c) mounting a chip to the connector in the molding zone;

(d) electrically connecting the chip to the connector; and (e) encapsulating the chip with molding material that is retained in the molding zone by the protection barriers so that the connection zones remain free of the molding material.

20. The method according to claim 19, wherein step (a) includes forming a support area for supporting the chip.

21. The method according to claim 20, wherein step (a) includes forming the support area inside the molding zone.

22. The method according to claim 21, wherein step (a) includes locating the metallic regions on a first plane and the support area on a second plane that is different from the first plane.

23. The method according to claim 22, wherein step (a) includes locating a portion of the connector on a third plane that is different from the first and second planes.

24. The method according to claim 19, wherein step (a) further includes deforming the portions of the metallic regions within the molding zone so that the portions are located in a plane different from a surface plane of the connector.

25. The method according to claim 24, wherein step (a) further includes forming a perforation in the portions of the metallic regions in the molding zone.

26. The method according to claim 19, wherein step (b) includes forming the barriers from a metal.

27. The method according to claim 19, wherein step (b) includes forming the barriers from a dielectric material.

28. The method according to claim 19, further comprising a step of removing the barriers after step (e).

29. The method according to claim 19, wherein step (b) includes compressing an insulator plastic material, in the form of a closed contour, against the connector and between the metallic regions.

30. The method according to claim 19, wherein step (b) includes forming the barriers with an elastomer seal provided in a mold.

31. The method according to claim 19, wherein step (d) includes connecting a coil to the connector.

32. The method according to claim 31, wherein step (e) includes encapsulating the coil with the molding material.

33. The method according to claim 31, wherein step (e) includes forming the molding material with a shape for receiving the coil.

34. A method of manufacturing individual chip card micromodules out of a tape of chip card micromodules according to claim 19.

35. The method according to claim 19, applied to a flip-bonding method.

36. The method according to claim 23, wherein steps (c) and (d) include using a tape automated bonding method.

37. The method according to claim 19, wherein the protection barriers remain in the chip card micromodule and are not removed after step (e).

38. The method according to claim 19, wherein step (e) includes encapsulating the chip with a thermohardening or thermoplastic material.

* * * * *